(12) United States Patent
Lee

(10) Patent No.: US 6,483,158 B1
(45) Date of Patent: Nov. 19, 2002

(54) SEMICONDUCTOR MEMORY DEVICE AND FABRICATION METHOD THEREFOR

(75) Inventor: Sang-Ho Lee, Choongcheongbuk-Do (KR)

(73) Assignee: Hyundai Electronics Industries Co., Ltd., Ichon-shi (KR)

( * ) Notice: Subject to any disclaimer, the term of this patent is extended or adjusted under 35 U.S.C. 154(b) by 0 days.

(21) Appl. No.: 09/481,495

(22) Filed: Jan. 12, 2000

(30) Foreign Application Priority Data

Apr. 8, 1999 (KR) ............................................. 99-12334

(51) Int. Cl.[7] .......................... H01L 29/76; H01L 29/00
(52) U.S. Cl. ....................... 257/408; 257/344; 257/513
(58) Field of Search ................................. 257/510, 513, 257/520, 344, 408, 900; 438/300, 301

(56) References Cited

U.S. PATENT DOCUMENTS

| | | | |
|---|---|---|---|
| 5,491,099 A | * 2/1996 | Hsu | 438/302 |
| 5,943,575 A | * 8/1999 | Chung | 438/300 |
| 6,004,878 A | * 12/1999 | Thomas et al. | 438/655 |
| 6,037,605 A | * 3/2000 | Yoshimura | 257/25 |
| 6,051,472 A | * 4/2000 | Abiko et al. | 438/296 |
| 6,071,783 A | * 6/2000 | Liang et al. | 438/301 |

FOREIGN PATENT DOCUMENTS

JP      6-151842    *  5/1994

* cited by examiner

Primary Examiner—Tom Thomas
Assistant Examiner—Hung Kim Vu
(74) Attorney, Agent, or Firm—Fleshner & Kim, LLP

(57) ABSTRACT

A semiconductor device and a fabrication method thereof which can, for example, prevent a punch-through from occurring by forming oxide spacers around source/drain regions in a semiconductor substrate instead of forming a conventional halo ion implanting layer. Such structure improves, for example, an operational speed by reducing junction capacitance, prevents a hot carrier effect from occurring by weakening an electric field around the drain region, and improves reliability by preventing a latch up from occurring. The semiconductor device includes a gate electrode formed on the semiconductor substrate, sidewall spacers formed at the sidewalls of the gate electrode, an impurity layer formed in the semiconductor substrate below each sidewall spacer, a trench formed in the semiconductor substrate at both sides of the gate electrode, oxide spacers formed at the bottom inside corner of each trench, and a conductive material filling up each trench.

7 Claims, 4 Drawing Sheets

SEMICONDUCTOR MEMORY DEVICE AND FABRICATION METHOD THEREFOR

BACKGROUND OF THE INVENTION

1. Field of the Invention

The invention relates to a semiconductor device, and in particular to a semiconductor memory device and a fabrication method therefor.

2. Background of the Related Art

In fabricating a related semiconductor memory device, higher integration requires shortening of the length of a MOSFET device channel therein. Therefore, when a high voltage is applied to a drain region of the MOSFET, a short channel may give rise to a punch-through defect. In order to overcome such a disadvantage, a halo ion implanting process, which involves implanting a p-type impurity into a semiconductor substrate inside a lightly doped drain (LDD) region, has been developed in an n-channel transistor.

A fabrication method of a related semiconductor device will now be described with reference to FIGS. 1A to 1C.

Referring to FIG. 1A, a gate oxide film 101 and a gate electrode 102 are formed atop a p type semiconductor substrate 100.

Thereafter, as shown in FIG. 1B, halo ion implanting layers 103 are formed by implanting boron ions below the gate electrode by performing a large angle tilt ion implantation process at approximately 25 to 30 degrees. The pocket impurity layers 103 are formed to be more highly doped than the semiconductor substrate 100. Lightly doped impurity layers 104 called lightly doped drains (LDD) are formed by using the gate electrode 102 as a mask and by implanting an impurity such as, for example, As or P ions into the p type semiconductor substrate 100.

As illustrated in FIG. 1C, an insulation film is formed on the resultant structure of FIG. 1B. An anisotropic etching is carried out thereon, and thus sidewall spacers 105 ions are formed at the sides of the gate electrode 102. Source/drain regions 106 are formed by using the sidewall spacers 105 as a mask and by implanting, for example, As or P ions into the semiconductor substrate at a high doping degree.

As a result, the impurity of an opposite conductive type to the source/drain regions forming the halo ion implanting layer is implanted around the LDDs at a high doping degree, and thus a depletion layer in a drain region is not expanded into a source region, thereby preventing the punch through effect.

However, the conventional semiconductor device has various disadvantages. For example, that the halo ion implanting layer is more highly doped than the semiconductor substrate, and thus an electric field of the source/drain region is increased, which results in a hot carrier effect. Accordingly, it weakens reliability of the semiconductor device. In addition, the junction capacitance is increased by the halo ion implanting layer, and thus an operational speed of the semiconductor device is reduced.

The above references are incorporated by reference herein where appropriate for appropriate teachings of additional or alternative details, features and/or technical background.

SUMMARY OF THE INVENTION

An object of the invention is to solve at least the various disadvantages of the background art and provide at least the advantages described below.

An object of the invention is to prevent a punch-through defect.

Another object of the invention to provide a semiconductor device and a fabrication method therefor in which an oxide film is formed around a source/drain region, instead of forming a halo ion implanting layer as in the related art.

In order to achieve the above-described object of the invention, there is provided a semiconductor device including: a semiconductor substrate; a gate oxide film formed on the semiconductor substrate; a gate electrode formed on the gate oxide film; trenches formed in the semiconductor substrate on the both sides of the gate electrode; an oxide spacer formed at a bottom corner of each trench; and a conductive material formed on each oxide spacer, and filling up each trench.

There is additionally provided a semiconductor device comprising a semiconductor substrate and a transistor formed on the substrate. The transistor comprises first and second trenches, an oxide spacer formed at a bottom inside corner of each the first and second trenches and a first conductive material formed at an upper portion of each oxide spacer and filling up each of the first and second trenches. The conductive material filling up each of the first and second trenches is preferably a doped polysilicon or a doped monocrystalline silicon formed by an epitaxial growth process. The device may further comprise a gate oxide film formed on the semiconductor substrate and a gate electrode formed on the gate oxide film with the first and second trenches formed respectively on each side of the gate electrode. An insulating sidewall spacer may be formed at each sidewall of the gate electrode, and an impurity layer may be formed in the semiconductor substrate below each sidewall spacer. Further, the conductive material in each of the first and second trenches may be operated as a source or drain of the transistor, respectively.

There is also provided a method for fabricating a semiconductor device including: forming a gate oxide film and a gate electrode on a semiconductor substrate; forming an impurity layer by implanting impurity ions into the semiconductor substrate on both sides of the gate electrode; forming a sidewall spacer at the sidewall of the gate electrode; forming trenches in the semiconductor substrate at the outer sides of both the sidewall spacers; forming an oxide spacer at a bottom corner of each trench; and filling up each trench with a conductive material.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements wherein.

DETAILED DESCRIPTION OF PREFERRED EMBODIMENTS

Figure 1A:
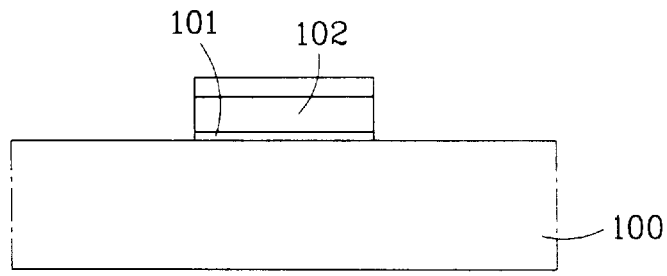
FIGS. 1A through 1C are vertical-sectional views illustrating sequential steps of a method for fabricating a related semiconductor device.
Figure 1B:
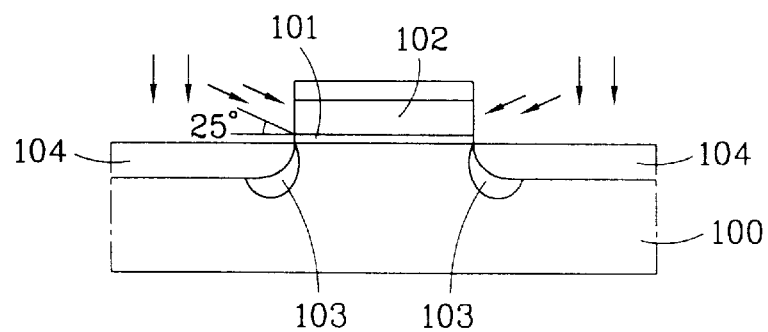
Figure 1C:
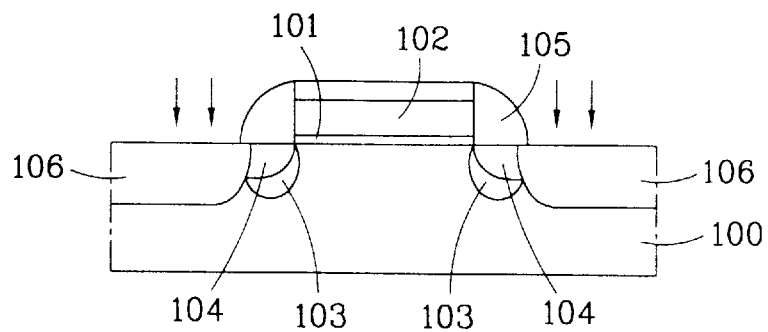
Figure 2:
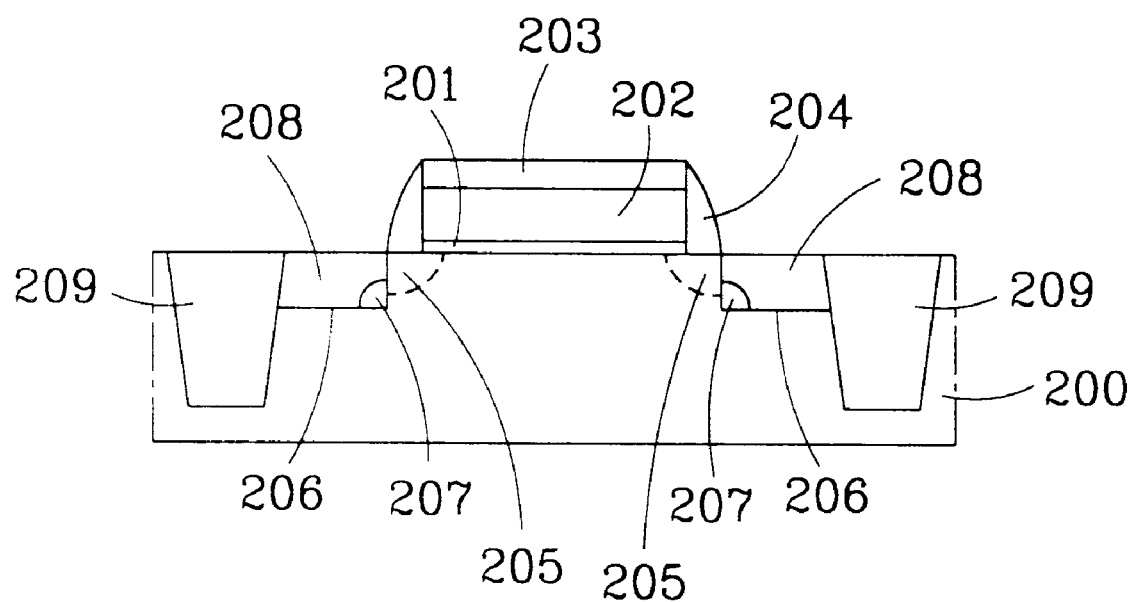
FIG. 2 is a vertical-sectional view illustrating a structure of a semiconductor device in accordance with a preferred embodiment of the invention.

FIG. 2 illustrates a structure of the semiconductor device according to a preferred embodiment of the invention. A gate oxide film 201 and a gate electrode 202 are formed on a semiconductor substrate 200. A gate electrode protecting film 203 is formed atop the gate electrode 202. Sidewall spacers 204 comprising an insulating material is formed at each side of the gate electrode 202. Shallow impurity layers 205 are formed in the semiconductor substrate 200 below the sidewall spacers 204. A recess, such as trench 206, is formed outside each shallow impurity layer 205 centering around the gate electrode 202. An oxide spacer 207 is formed at an inside bottom corner of each trench 206, and serves preferably to prevent a punch-through defect from occurring. In addition, a conductive material layer 208 is filled in each trench 206 atop each oxide spacer 207. The conductive material layers 208 serve as the source/drain of a transistor, and are preferably formed of doped polysilicon or monocrystalline silicon. Reference numerals 209 signate isolation regions of the semiconductor device.

A method for fabricating the semiconductor device in accordance with a preferred embodiment of the invention, as shown in FIG. 2, will now be described.

Figure 3A:
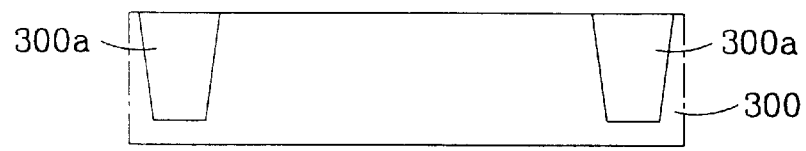
FIGS. 3A through 3F are vertical-sectional views illustrating steps of a method for fabricating a semiconductor device in accordance with a preferred embodiment of the invention.

Referring to FIG. 3A, device isolating regions 300a are formed at predetermined locations in a semiconductor substrate 300. Processes for forming the device isolation regions 300a may include, for example, a local oxidation of silicon (LOCOS), a shallow trench isolation, a profiled groove isolation (PGI); however other processes may also be appropriate. The device isolation regions 300a serve to electrically isolate the individual devices. A thick insulation film, preferably silicon oxide film, is provided between the individual devices regardless of the formation method utilized.

Figure 3B:
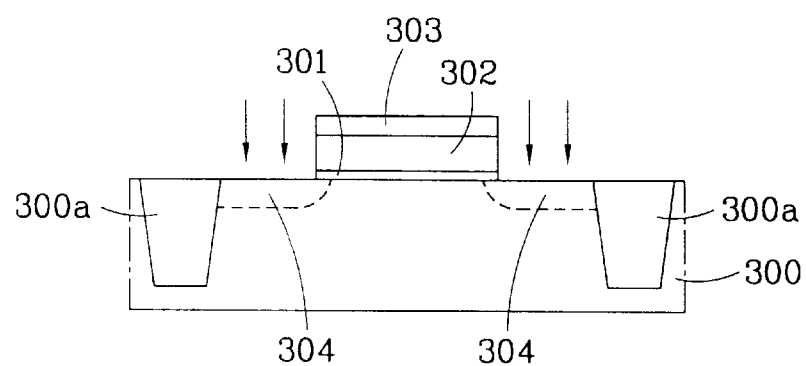

As shown in FIG. 3B, a gate oxide film 301 and a gate electrode 302 are formed on a semiconductor substrate 300 between the device isolating regions 300a. A gate protecting film 303 is formed atop the gate electrode 302. The gate oxide film 301 is preferably a silicon oxide film preferably formed by a thermal oxidation. The gate electrode 302 preferably comprises a polysilicon and tungsten or tungsten silicide stacked thereon. The gate electrode protecting film 303 preferably comprises a silicon nitride film preferably formed by a high temperature and low pressure chemical vapor deposition. Thereafter, a light doping of impurity ions is implanted into the semiconductor substrate 300 at both sides of the gate electrode 302. The impurity ions are diffused during a succeeding thermal process, and thus form the lightly doped impurity layers 304. In general, the lightly doped impurity layers 304 are called lightly doped drains (LDD).

A silicon nitride film is deposited as an insulation film on the entire resultant structure shown in FIG. 3B. Thereafter, an anisotropic etching is performed to form a sidewall spacer 305 at each sidewall of the gate electrode 302. Trenches 306 are formed by using the sidewall spacers 305 and the device isolation regions 300a as self-aligning masks and by etching the semiconductor substrate 300 between the sidewall spacers 305 and the device isolation regions 300a to a predetermined depth, as shown in FIG. 3. The depth of the trenches 306 corresponds to the source/drain region of the transistor. In a semiconductor memory device, such as, for example, a 64MB DRAM as currently fabricated, it is advantageous that the depth of the trenches is set between approximately 0.1 $\mu$m and 0.3 $\mu$m.

Figure 3C:
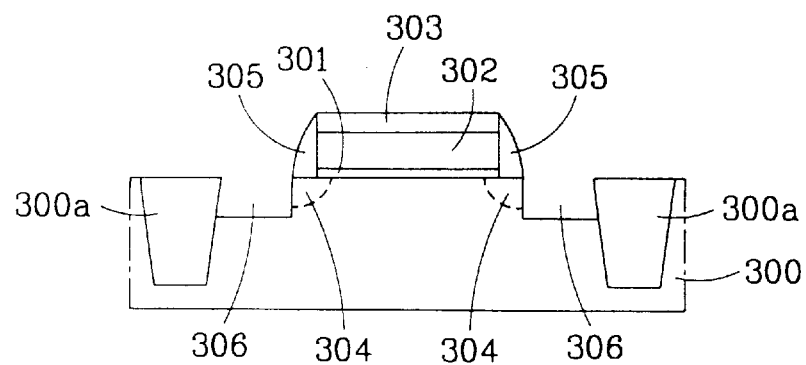
Figure 3D:
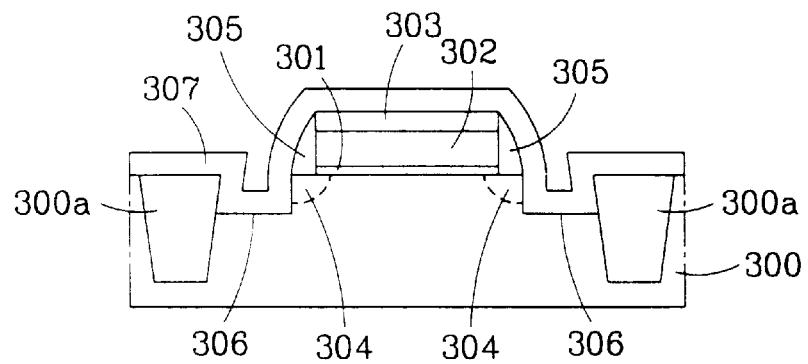
Figure 3E:
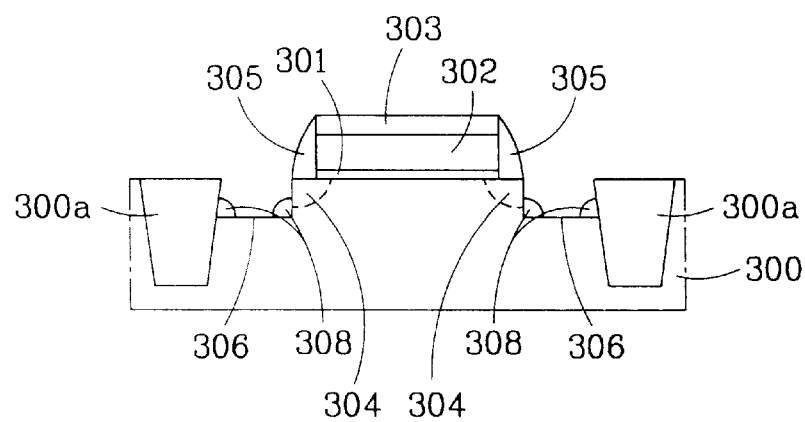

Referring to FIG. 3D, a silicon oxide film 307 is deposited as an insulation film over the entire resultant structure showing in FIG. 3C preferably by a chemical vapor deposition. As shown in FIG. 3E, a spacer 308 is formed at the bottom inside corner of each trench 306 preferably by carrying out an anisotropic etching on the insulation film 307. The spacer 308 serves preferably to prevent the punch-through from occurring.

Figure 3F:
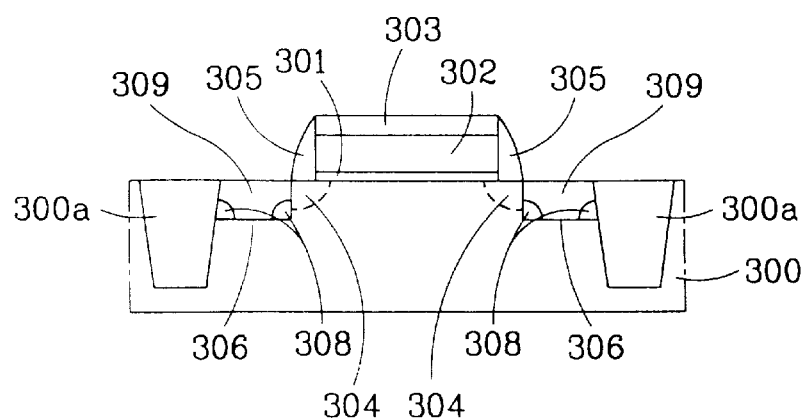

As illustrated in FIG. 3F, each trench 306 is filled with a conductive material layer 309. The conductive material layers 309 are preferably a doped polysilicon preferably formed by a chemical vapor deposition or a doped monocrystalline silicon formed by a selective epitaxial growth process.

The method of filling of the doped polysilicon in the trench can be performed by mixing a gas including impurity ions (for example, $POCl_3$) with a reaction gas, depositing the polysilicon, and carrying out an anisotropic etching, during the process of depositing the polysilicon on the entire structure shown in FIG. 3E. In addition, the conductive material layers 309 may be the doped monocrystalline silicon formed by a selective epitaxial growth process. An epitaxial layer is grown merely at the bottom portion of the trench connected to the semiconductor substrate, when the selective epitaxial growth process is employed. Accordingly, it is not required to carry out the etching process after forming the monocrystalline silicon layer. As a result, there is an advantage in that the entire process is more simplified, as compared with the process of forming the polysilicon layer by the chemical vapor deposition. The conductive material layers 309 serve as the source/drain regions of the transistor.

The semiconductor device and fabrication method therefor have many advantages. For example, in the semiconductor device according to the invention, a halo ion implanting layer is not required, and thus the junction capacitance between the halo ion implanting layer and the source/drain region is not formed, thereby improving the operational speed.

In addition, according to the invention, because the highly doped halo ion implanting layer is not employed, the electric field is relatively weakened, as compared with the related art. Accordingly, the hot carrier effect is hardly generated, and as a result a latch-up is prevented from occurring, thereby improving reliability of the semiconductor device.

Furthermore, according to the invention, a margin for preventing a short channel effect is obtained, and thus the integration degree of the semiconductor device is improved.

The foregoing embodiments and advantages are merely exemplary and are not to be construed as limiting the present invention. The present teaching can be readily applied to other types of apparatuses. The description of the present invention is intended to be illustrative, and not to limit the scope of the claims. Many alternatives, modifications, and variations will be apparent to those skilled in the art. In the claims, means-plus-function clauses are intended to cover the structures described herein as performing the recited function and not only structural equivalents but also equivalent structures.

What is claimed is:

1. A semiconductor device, comprising:
a substrate with a top surface that extends in a first direction;
a gate oxide film formed on the top surface of the substrate;
a gate electrode formed on the gate oxide film;
an insulating sidewall spacer formed at each sidewall of the gate electrode;
a recess formed in the substrate on each side of the gate electrode;
a lightly doped impurity layer formed in the substrate below each insulating sidewall spacer and adjacent to a top edge of each recess;
an oxide spacer formed in each recess only at a bottom inside corner of each recess, wherein each oxide spacer does not extend to an upper surface of its respective recess and wherein each oxide spacer only partially overlaps the impurity layer located at the top edge of its respective recess along a second direction, which is perpendicular to the first direction; and
a conductive material formed in each recess to form a source or a drain.

2. The device according to claim 1, wherein the conductive material is formed at an upper portion of each oxide spacer.

3. The device according to claim 1, wherein the conductive material in each of the recesses is operated as source or drain of a transistor, respectively.

4. The device according to claim 1, wherein the conductive material is at least one of a doped polysilicon and a doped monocrystalline silicon.

5. The device according to claim 1, wherein the recess is a trench.

6. The device according to claim 1, wherein the oxide spacer only partially overlaps the impurity layer such that a portion of the impurity layer along the second direction directly contacts the conductive material.

7. The device according to claim 1, wherein the gate electrode partially overlaps the impurity layer along the first direction.

* * * * *